United States Patent
Krames et al.

(10) Patent No.: US 6,229,160 B1
(45) Date of Patent: *May 8, 2001

(54) LIGHT EXTRACTION FROM A SEMICONDUCTOR LIGHT-EMITTING DEVICE VIA CHIP SHAPING

(75) Inventors: Michael R Krames, Mt View; Fred A Kish, Jr., San Jose; Tun S Tan, Cupertino, all of CA (US)

(73) Assignee: LumiLeds Lighting, U.S., LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/868,009

(22) Filed: Jun. 3, 1997

(51) Int. Cl.[7] .................................................... H01L 33/00
(52) U.S. Cl. ................................ 257/94; 257/95; 257/98
(58) Field of Search .................................. 257/13, 94, 95, 257/98, 79

(56) References Cited

U.S. PATENT DOCUMENTS

| 4,218,692 | 8/1980 | de Cremoux ........................... 257/82 |
| 4,485,391 | 11/1984 | Poulain et al. ......................... 257/82 |
| 5,087,949 | 2/1992 | Haitz . | |
| 5,218,223 | * 6/1993 | Spaeth et al. ......................... 257/436 |
| 5,260,588 | * 11/1993 | Ohta et al. .............................. 257/93 |
| 5,376,580 | 12/1994 | Kish et al. . | |
| 5,517,039 | 5/1996 | Hewlett-Packard ..................... 257/95 |
| 5,705,834 | 1/1998 | Egalon et al. ........................... 257/95 |
| 5,714,014 | 2/1998 | Denko .................................... 148/33 |

FOREIGN PATENT DOCUMENTS

| 0001728 A1 | 9/1978 | (EP) . |
| 0051505 A1 | 10/1981 | (EP) . |
| 2964822 | 10/1999 | (JP) . |

OTHER PUBLICATIONS

Photometric Figures of Merit for Semiconductor Luminescent Sources Operating in Spontaneous Mode, by W. N. Carr, Infrared Physics, 1966, vol. 6, pp. 1–19.

Efficient Al–Ga–As heterojunction light–emitting diode, by Zh. I. Alferov, V. M. Andreev, D. Z. Garbuzov, N. Yu. Davidyuk, B. V. Egorov, B. V. Pushnyi, and L. T. Chichua; Sov. Phys. Tech. Phys. 23(4) Apr. 1978; pp. 476–480.

Shaped Electroluminescent GaAs Diodes, by A. R. Franklin and R. Newman; Journal of Applied Physics, vol. 35, No. 4, Apr. 1964, pp. 1153–1155.

Coatings and Filters, by J. A. Dobrowolski; Division of Physics, National Research Council of Canada, Ottawa, Ontario; Section 8, pp. 8–1 thru 8–124, 1972.

* cited by examiner

Primary Examiner—Minh Loan Tran
(74) Attorney, Agent, or Firm—Skjerven Morrill MacPherson LLP; Brian D. Ogonowsky; Rachel V. Leiterman (57) ABSTRACT

The invention is a method for designing semiconductor light emitting devices such that the side surfaces (surfaces not parallel to the epitaxial layers) are formed at preferred angles relative to vertical (normal to the plane of the light-emitting active layer) to improve light extraction efficiency and increase total light output efficiency. Device designs are chosen to improve efficiency without resorting to excessive active area-yield loss due to shaping. As such, these designs are suitable for low-cost, high-volume manufacturing of semiconductor light-emitting devices with improved characteristics.

18 Claims, 11 Drawing Sheets

LIGHT EXTRACTION FROM A SEMICONDUCTOR LIGHT-EMITTING DEVICE VIA CHIP SHAPING

FIELD OF THE INVENTION

The invention relates to the process of designing and fabricating semiconductor light-emitting devices. In particular, the invention is directed towards improving the light extraction efficiency and increasing the total light output of these devices.

BACKGROUND OF THE INVENTION

The extraction efficiency of semiconductor light-emitting devices (LEDs) is limited by the large contrast between the optical refractive indices of semiconductor materials ($n_s$~2.2–3.6) and that of the surrounding media, typically air ($n_a$~1.0) or optically transparent epoxy ($n_e$~1.5). This large difference in refractive indices causes photons within the device to have a high probability of being totally-internally-reflected (TIR) when impinging on interfaces between the semiconductor and the ambient media.

To illustrate, for a cube of GaP (optically transparent for wavelengths>555 nm) surrounded by epoxy, a photon $\lambda$>555 nm within the GaP ($n_s$~3.3) striking one of the six interfaces with epoxy ($n_e$~1.5) must impinge at an angle less than $\theta_c$=~27° (relative to normal) to avoid being TIR. This constrained range of angles for which transmission is possible defines an "escape cone" for the photon. If the photon is emitted from within the GaP with an equal probability of emission in any direction within $4\pi$ steradians, the probability of striking any of the interfaces within an escape cone is 33%. Accounting for Fresnel reflection, the probability of the photon actually being transmitted into the epoxy is 28.4%.

Figure 1:
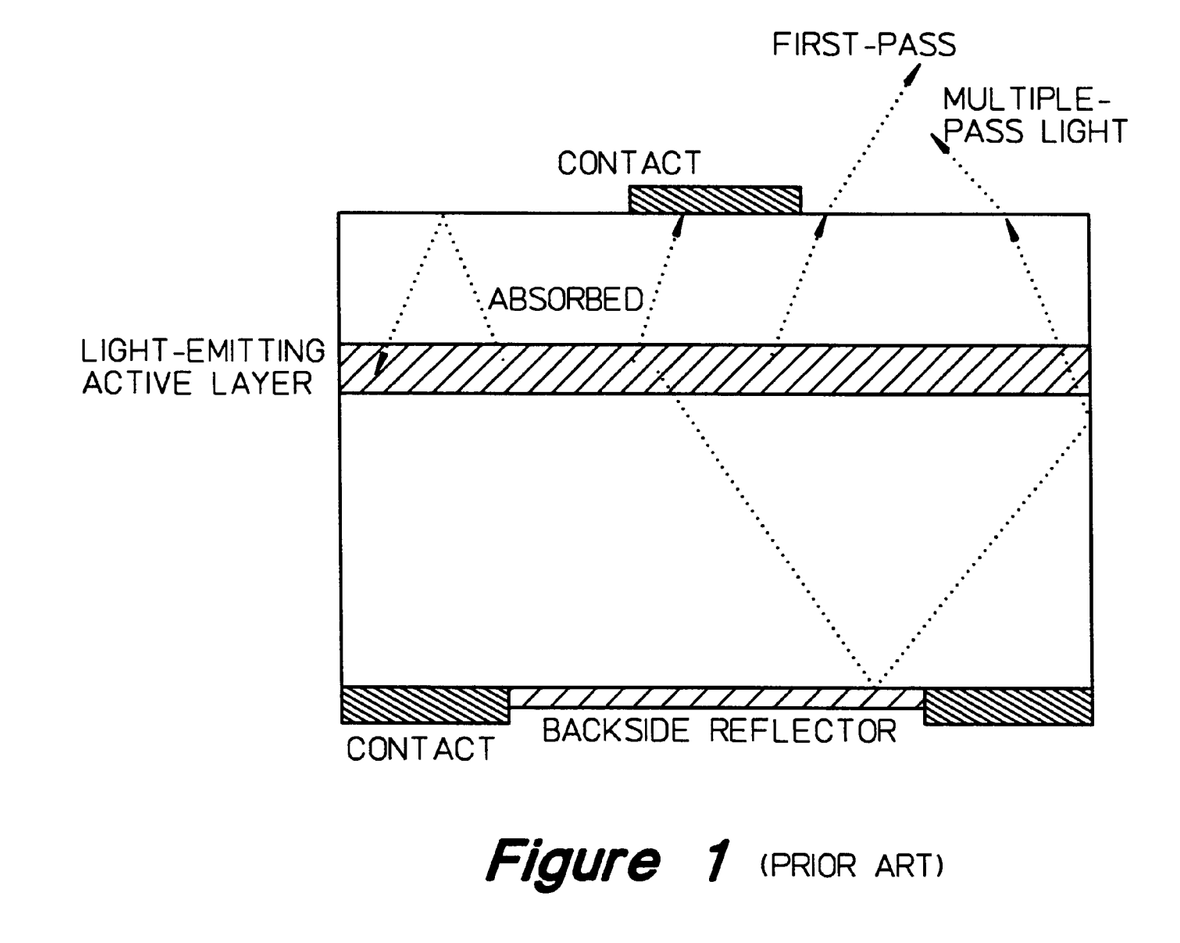
FIG. 1 is a schematic diagram illustrating light paths in a conventional light emitting device.

Commercial LEDs are non-ideal devices that contain many optical loss mechanisms, e.g. active layer re-absorption, absorption within internal epitaxial layers, finite ohmic contact reflectivity, free-carrier absorption within doped regions. In particular, for devices with emission layers of low internal quantum efficiency, the loss mechanisms due to the active layer can limit extracted light to only those photons which escape the device without making a second pass through the active layer after emission. This suggests a limit on the achievable extraction efficiency of such devices to not much more than 28.4% (based on the above calculation). To illustrate, the coefficient of absorption for a band-to-band process at the emission wavelength is on the order of $10^4$ cm$^{-1}$. A photon making a single pass through an emission layer of typical thickness of 1 $\mu$m, has a probability of being absorbed equal to 63%. For low quantum efficiency material, the probability of re-emission as a photon is relatively low, for example ~10%. Thus the first-order probability of the initial photon being absorbed and converted to a non-radiative process is 57%. The problem is exacerbated by other loss mechanisms and by the fact that a majority of photon trajectories traverse more than just the vertical thickness of the active layer. Thus, much of the light escaping the device is light that is transmitted through the semiconductor/ambient interfaces immediately upon first impinging such an interface. This light is "first-pass" light. FIG. 1 shows a schematic diagram depicting first-pass light and some of the aforementioned photon loss mechanisms and paths for escape. "Multiple-pass" light is the light which escapes the chip only after multiple encounters with the surfaces of the LED chip.

Some losses can be reduced by decreasing the thickness of the light-emitting active region and any other absorbing layers. However, fundamental limitations in the materials growth and device physics (e.g. carrier confinement, interfacial recombination) limit the minimum thickness of the active layer at which reasonable radiative efficiencies can be achieved. The selection of the active layer thickness (for material of low radiative efficiency) is a trade-off between internal radiative efficiency and extraction efficiency. Devices of the highest attainable extraction efficiencies will arise from semiconductor LED structure designs that provide for much of the internally emitted light being first-pass. Indeed, even in structures of relatively high internal quantum efficiency, loss due to ohmic contacts and free-carrier absorption still compel designs for more first-pass light extraction. One approach to improve light extraction is to modify the shape or geometry of the chip.

One such shape is the inverted truncated cone device, where the p-n junction is located at or close (within several $\mu$m) to the plane of truncation, as disclosed by Franklin, et al., in the Journal of Applied Physics vol. 35, 1153 (1964). The device exhibits enhanced forward-directional light emission characteristics and improved external efficiency. The shaped sidewalls of the conical portion redirect light impinging on this surface towards the top surface at near normal incidence. In Infrared Physics 6, 1(1966), Carr determined that there is a minimum top window height beyond which efficiency no longer increases and further suggests an optimal angle, $\beta_m=(\pi/2-\theta c)/2$, where $\theta_c$ is the critical angle for total internal reflection, for maximum efficiency. This analysis neglects internal absorption and secondary reflections. The light measured is emitted only from the top surface of the device. For high-flux applications, these devices (Franklin, et al. and Carr) are sub-optimum in that they do not utilize side-light which can be 40% or more of the total extracted light from an LED. Also, this device does not employ a heterojunction and would suffer reduced injection efficiency at room temperature relative to the published data at T=77 K. Furthermore, the upper extraction window for this homojunction device is not transparent to a substantial portion of the photons generated within the p-n junction active region. With the internal quantum efficiency of GaAs LEDs typically close to 100% (especially at T=77 K), the relatively low measured value of external quantum efficiency (<10% in air) indicates that omission of side-light collection and poor transparency are contributing to significantly reduced extraction efficiency in this device design.

In "Sov. Phys. Tech. Phys. 23, 476 (1978)", Alferov et. al. disclosed another shaped LED using a double-mesa structure that improves extraction efficiency by providing bounce paths that avoid the active region and back surface of the device for multiple-pass light. Mesa etching of the sidewall surfaces does not allow control over the angle of the sidewalls which is an important parameter for light extraction and die cost. Also, the double mesa device exhibits an area-ratio from top surface to active area on the order of 9 or more. This area-ratio is the number of devices that can be yielded per unit area on a wafer. Since the reduction in area yield (~9×) is significantly greater than the observed gain in extraction efficiency (<3× compared to conventional geometries), this device approach is unsuitable for cost-effective high-volume manufacturing.

In U.S. Pat. No. 5,087,949, issued Feb. 11, 1992, Haitz disclosed an LED with diagonal faces for improved light extraction. The active layer in the LEDs is located nearly adjacent to the larger-area base (away from the imaginary apex of the pyramid shape). Consequently, light-emitting regions near the perimeter of the active layer do not fully benefit from the angled sides as do the central regions of the active layer. Therefore, the effective extraction efficiency gains in such a device are limited.

SUMMARY OF THE INVENTION

By shaping a semiconductor light-emitting device (LED) such that the side surface(s) that are oriented at an angle(s) offset relative to the direction normal to the plane of the light-emitting layer, the total light extraction is increased. By employing a p-n heterojunction for high injection efficiency, and transparent windows for low-loss optical extraction out both the top and side surfaces, high total external quantum efficiencies are achieved. Finally, the device designs and fabrication techniques are suitable to high-volume manufacturing. Methods of providing transparent windows via wafer-bonding and epitaxial regrowth allow precise positioning of the p-n junction and effect control over both device characteristics and yield. The preferred device design improves overall extraction efficiency while maintaining a reasonable degree of yielded devices per unit area on a wafer.

The device shape provides an optical path from the active layer to the ambient media which minimize encounters with the optical loss mechanisms present within the device. This function is performed by shaped sidewalls that reflect light towards the top surface of the device to within the critical angle of transmission to the ambient, and which furthermore allow TIR light from the top surface to escape out the shaped sidewalls. Thus first-pass light extraction is increased. Also, while orienting light for transmission into the ambient, the shaped sidewalls also inherently provide a relatively larger volume of low-loss material through which photons may pass a number of times without encountering the absorbing active layer or ohmic contact, i.e. the solid-angle cross-section of the active layer and ohmic contact have been reduced relative to the case of a conventional chip. Furthermore, the shaped device does not require excessive multiple passes or prohibitively long mean path-lengths for photons within the device before transmission and so does not suffer as extensively due to free-carrier absorption.

DETAILED DESCRIPTION OF THE INVENTION

Figure 2:
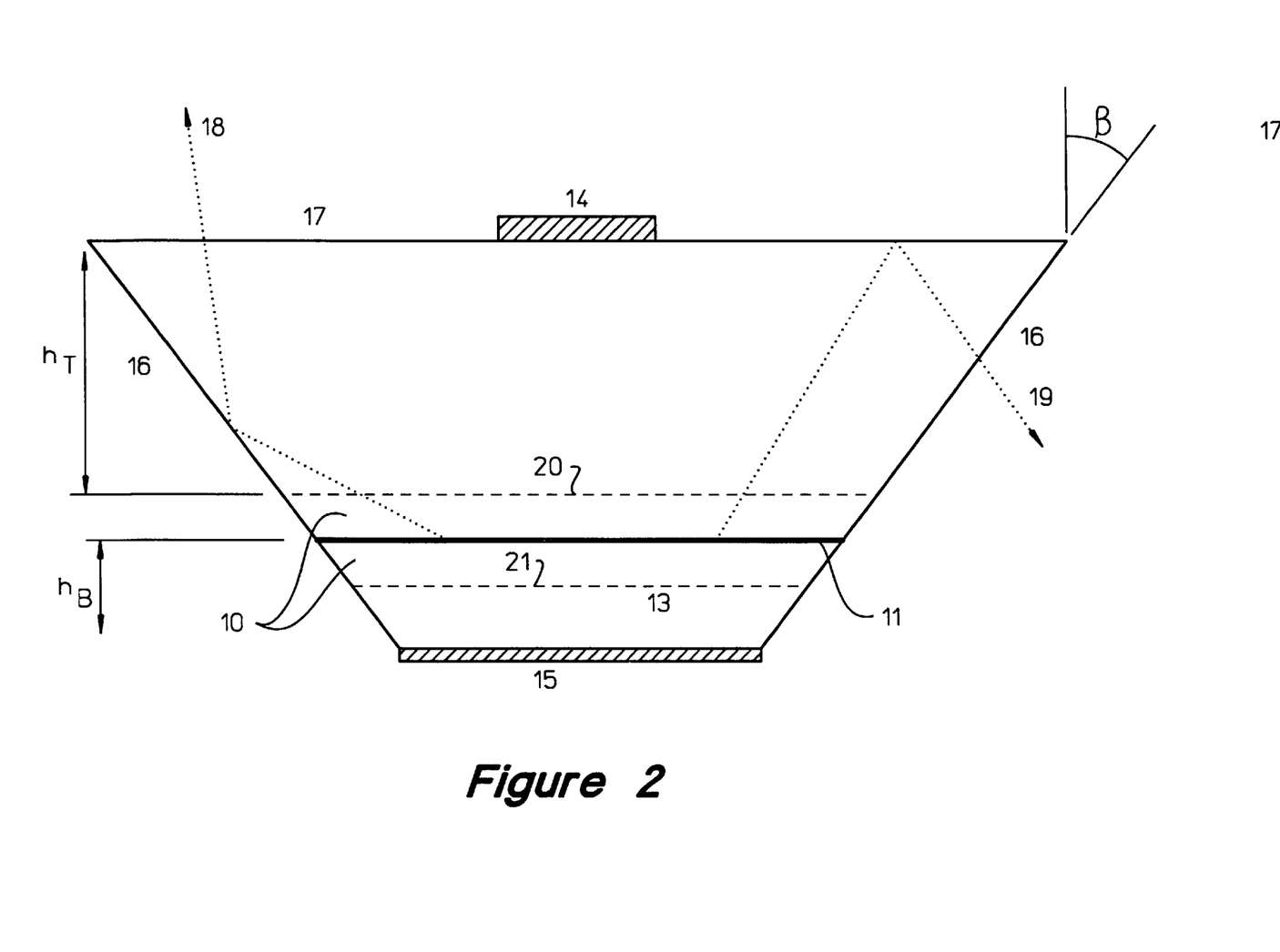
FIG. 2 illustrates a side view of a preferred embodiment.

A side-view of a preferred embodiment of a semiconductor light-emitting device (LED) is shown in FIG. 2. The LED includes a heterostructure comprising a plurality of p- and n-type doped epitaxial layers 10 grown on a substrate, e.g. GaAs, GaP, or sapphire. The p- and n-type layers are arranged to provide a p-n junction region in or near an active region 11. The resulting heterojunction provides for high injection efficiency at room temperature and is essential for devices in high-power applications. The area extent of the p-n junction region defines the active device area. For high-flux applications, the active device area is preferably greater than 150 mil$^2$.

The growth substrate may optionally be removed and replaced via wafer-bonding, e.g. Kish in U.S. Pat. No. 5,376,580, issued Dec. 27, 1994, or regrown to provide a new substrate with favored characteristics. This is desirable when the growth substrate absorbs the wavelength of light emitted from the active region. In the present invention, wafer-bonding may be used to facilitate the attachment of an arbitrary-thickness transparent window layer. A layer is transparent if its optical absorption coefficient is less than 20 cm$^{-1}$ at the wavelength corresponding to the bulk energy bandgap of the material in the active area.

A transparent substrate or layer 12, a window for light extraction (and current spreading) is the top window layer for the device. Similarly, a window layer 13 for light extraction (and current spreading) may be attached to the epitaxial layers on the side opposite the top window layer by wafer-bonding, epitaxial growth, or regrowth, to become the bottom window layer. This flexibility allows the active layer to be arbitrarily positioned within the device, facilitating the ability to trade off light-output increase vs. active-area yield per unit area on a wafer.

Top and bottom electrical ohmic contacts 14, 15 attached to the window layers allow injection of electrons and holes into the p-n junction region for recombination and the subsequent generation of light from the active region. For high power applications, the resistance of either contact should be less than 2 ohms. Preferably, the specific contact resistance of either contact is less than 5×10$^{-5}$ ohms-cm$^2$ to provide low resistance contacts with smaller areas. This allows one to minimize occlusion and absorption caused by the contacts. The p- and n-type ohmic contacts may be made on a single surface orientation of the device to minimize wire-bond connections and to reduce light occlusion caused by a top contact.

The top window layer need not be conductive, and may consist of undoped semiconductor material, crystalline or poly-crystalline, or amorphous material with suitable properties, or partially so, consisting of multiple layers with different characteristics. The material and the light-emitting layer preferably have similar refractive indices. Additionally, one or both of the contacts may be made to any or all of the side surfaces of the device.

In a preferred embodiment, the sidewalls 16 of the primary window are oriented at an angle (or angles) β relative to the vertical direction such that the area extent of the top surface 17 is greater than that of the active device area. The sidewall makes an oblique angle with respect to the heterostructure. β need not be constant as a function of device height (as shown in FIG. 2), but may vary continuously according to device height to result in either partially or wholly concave or convex sidewall shapes. The sidewall orientation causes light which strikes the sidewalls to be TIR into an escape cone at the top surface of the device, as shown by ray 18 in FIG. 2. Much of the light which is TIR at the top surface is redirected into an escape cone at the sidewalls, shown by ray 19. Side light accounts for ~40% or more of the total externally emitted light. This results in an increase in first-pass light extraction.

The relative increase in surface area of the semiconductor/ambient interfaces relative to that of the top contact or of the active region reduces the probability of a photon being absorbed at those regions. This latter effect is more noticeable as the angle $\beta$ and the height $h_T$ of the transparent top-window layer are increased. Although the overall light extraction theoretically increases with increasing $\beta$ and $h_T$, practical limitations arise in the choice of values of these parameters.

To illustrate, for an active region area of 20 mils×20 mils, the preferred dimensions are a sidewall angle $\beta=20°-50°$ and top-window height $h_T=2$ to 15 mils. The upper limits on $\beta$ and $h_T$ are chosen with regards to maintaining a reasonable area-yield per wafer. Within this geometry, it is possible to improve the light extraction of upwardly-emitted light from the active layer by a factor of about 1.8 relative to a conventional device. Accounting for the downward-emitted light, which does not initially see the same effect, the overall effect on light extraction is on the order of 1.4. For finite absorption in the active layer and a reflective back contact, the extraction-efficiency gain of the top window is also observed by downward-emitted light, so that the gains over conventional devices may approach a factor of 1.5 or more. Even so, if absorption associated with the light-emitting layer is greater than 50% per pass, downward-emitted light cannot be expected to be efficiently redirected towards the top window. There is a benefit to providing a bottom window 13 for light extraction, as depicted in FIG. 2. This window layer should be thick enough to allow an appreciable amount of first-pass light escape out the sides of the device, while allowing a large enough bottom surface for mounting stability and heat-sinking. This layer may be 2–10 mils thick, and is preferably 10–40% of the lateral width of the active region in thickness. This design choice provides for significant out-coupling of light through the sides of the bottom window while maintaining an aspect-ratio that provides for mechanical stability. A practitioner of the art will appreciate that all dimensions scale with the area of the active region. This concept is extendable to other geometries.

Figure 3:
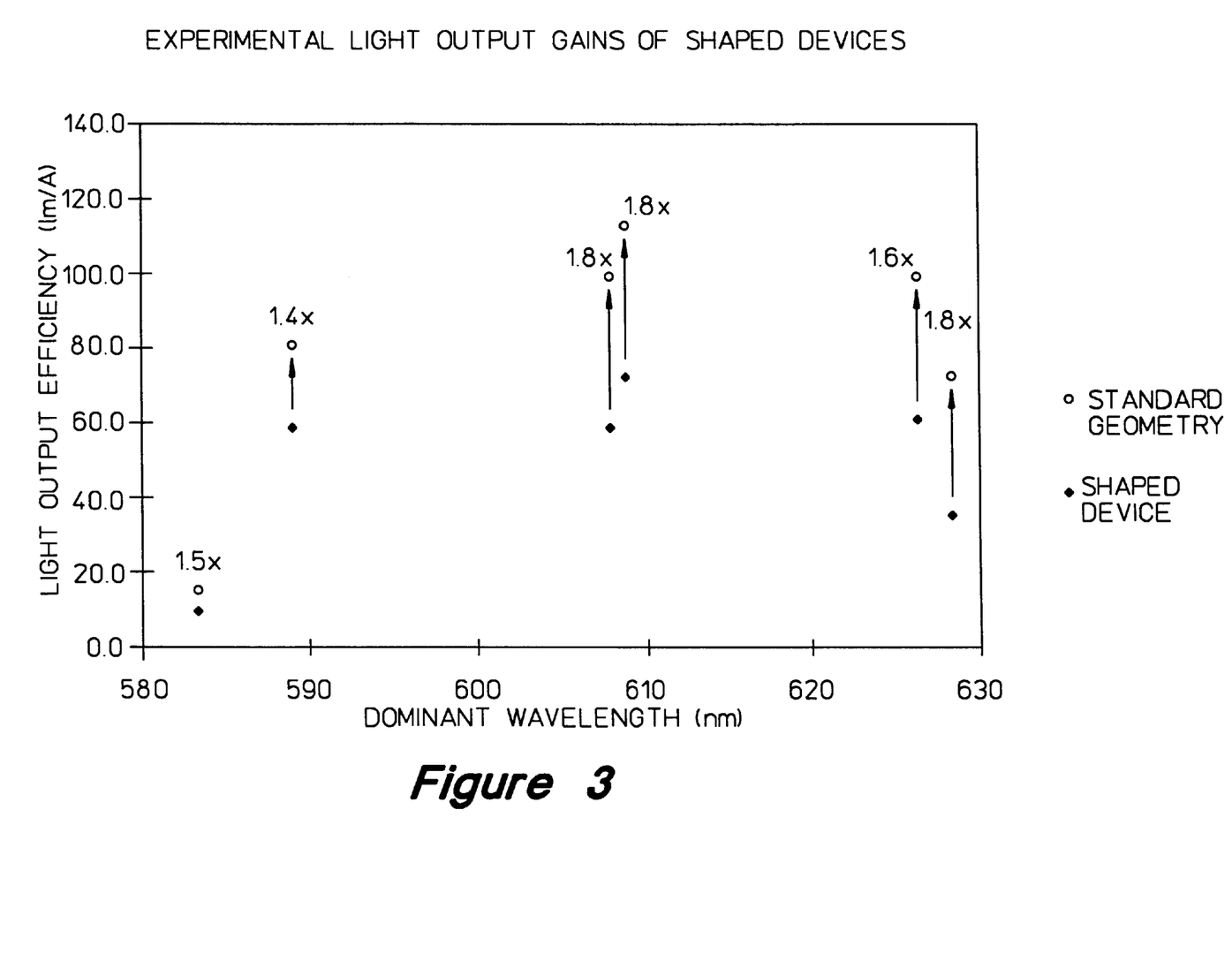
FIG. 3 exhibits experimental light extraction gains from a preferred embodiment.

Experimental observations of increased light output from shaped devices are shown in FIG. 3. These devices have a square active area (shown in FIG. 5) and four side surfaces angled at 35° relative to normal (shown in FIG. 2). The top window thickness (above the active region) is ~200 μm and the bottom window thickness (below the active region) is ~50 μm. Light output gains of 1.4×–1.8× are observed for these shaped devices relative to conventional devices (rectangular parallelipiped geometry) from the same wafer. All devices were encapsulated in epoxy (n~1.5). It can be seen from FIG. 3 that relative light output gains are observed for a wide range of wavelengths, while the absolute efficiencies depend simply on the choice of starting material.

Figure 4:
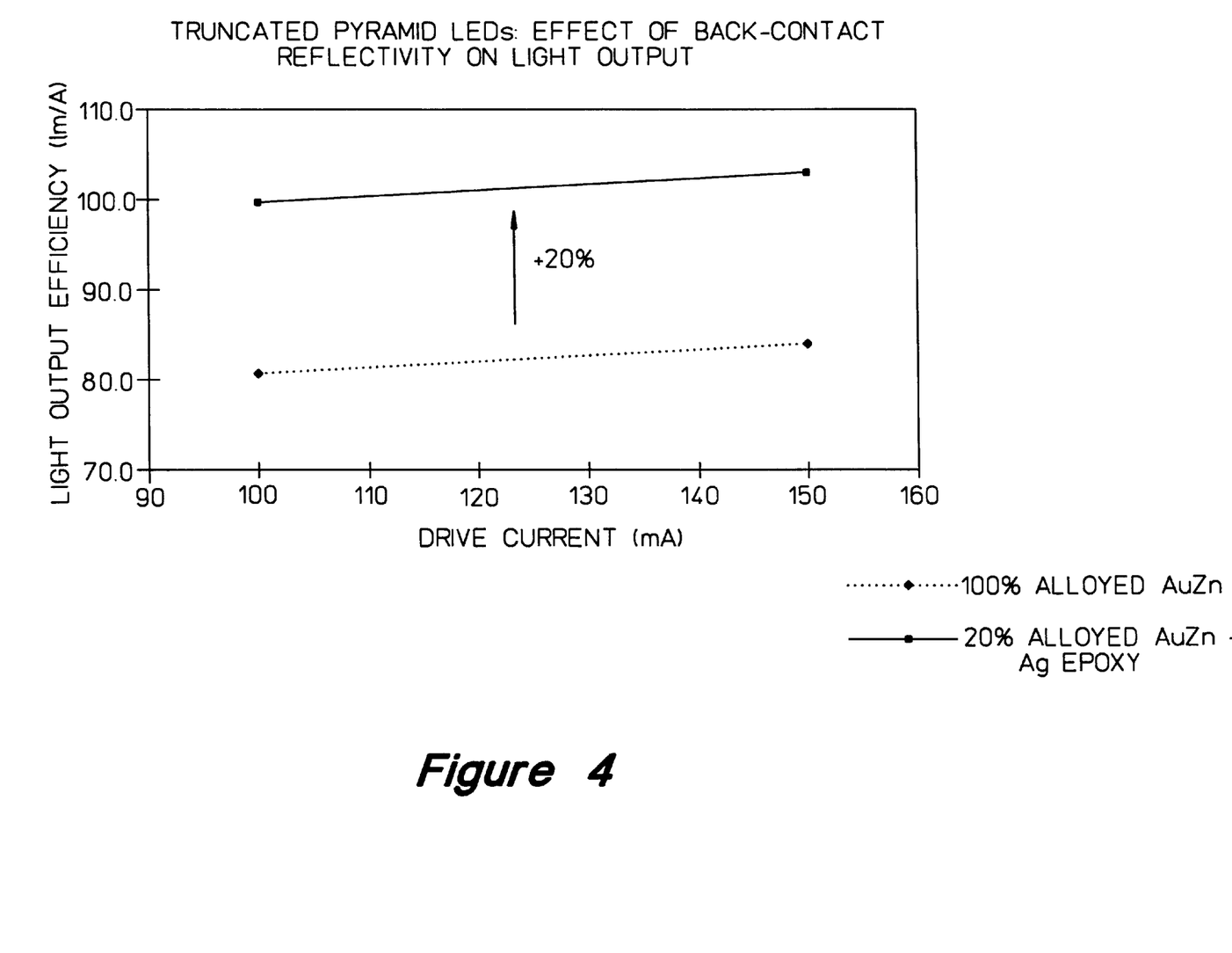
FIG. 4 exhibits further experimental light extraction gains from a preferred embodiment.

For devices with the active layer in close proximity (within 20% of the active-area width in thickness) to the bottom of the device, it is preferable to provide a highly reflecting back contact in order to achieve the highest extraction efficiency gains. Experimental data on light output of inverted truncated pyramid devices is shown in FIG. 4. Using full-sheet alloyed AuZn as a back contact, light output suffers due to the poor reflectivity provided by such a contact. Instead, by using a patterned AuZn back contact (~20% area coverage) in conjunction with reflective Ag-based die-attach epoxy (total angle-averaged reflectivity >~50%), total light output is increased by ~20%.

Figure 5:
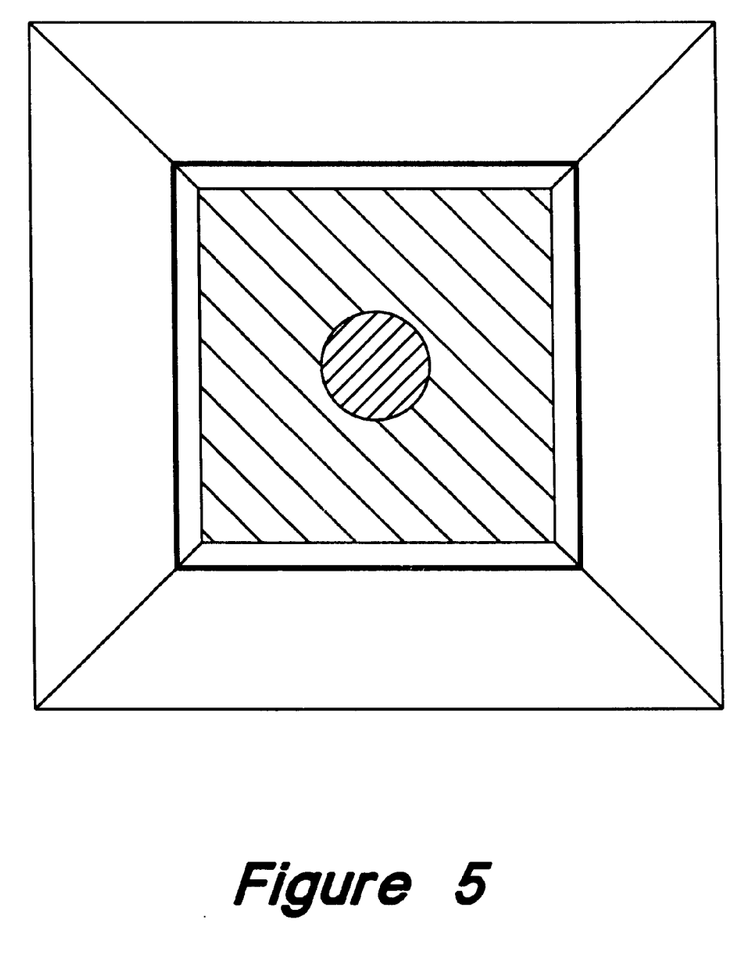
FIG. 5 illustrates a plan view of a preferred embodiment.

The side view in FIG. 2 is commensurate with a variety of device geometries. A plan view is shown in FIG. 5 for a square or rectangular base. In this inverted truncated-pyramid device, there are four distinct sidewalls of the device that are oriented at an angle (or angles) $\beta$ relative to vertical. The device may be fabricated by sawing the device wafer using a saw-blade with a beveled ("V-shaped") cutting profile to define the slant for the sidewalls. Instead the device may be fabricated by masking a portion of the wafer and forming the desired geometry by sandblasting, and by controlling the angles by varying the parameters of the sandblast operation. Further, the angles may be defined by scribing preferentially along specified crystallographic planes to form a preferred device geometry.

Another method is to suitably mask a portion of the LED wafer and form the geometry by dry or wet etching. The crystallographic nature of the substrate may be important in these cases. For example, (111) GaP may be wafer-bonded to the epitaxial layers to provide the top window layer. This material may be etched or cleaved to expose angled crystal facets that provide the angled side-surfaces for improved light extraction in a light-emitting device. If desired, the window layer may be attached by wafer bonding by including an intermediary material (e.g., transparent ITO, very thin layer of AuGe, or AuZn) to facilitate a wafer-bonded interface that is conductive and reasonably transparent. The crystallographic orientation of the substrate is chosen to effect reasonable control over chip shaping without compromising other device performance characteristics. After any initial "rough" shaping processes, it may be necessary to use "fine" shaping processes to arrive at the final desired shape and/or to produce very smooth sidewalls that are desired for a properly functioning device. In other embodiments, the device may have a different number of shaped side surfaces, e.g. three surfaces for an inverted truncated triangular-pyramid device. Photoelectrochemical etching may also be used to either shape or singulate the devices. Many device geometries will work under the principle of the present teaching, with a chosen geometry determined by the requirements of a specific device application and by cost and manufacturing considerations.

Figure 6:
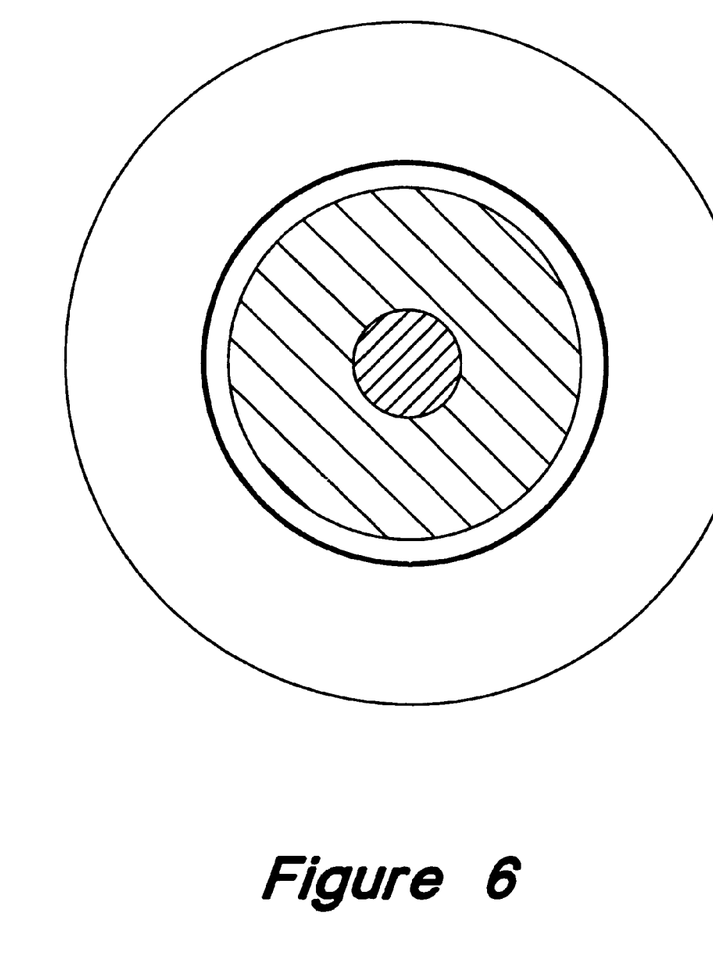
FIG. 6 illustrates a plan view of an alternate embodiment.

A plan view of an alternate embodiment is shown in FIG. 6. The inverted truncated-cone has a base that is circular (in general, elliptical). This device may be formed or approximated by proper processing of the material by any of the methods aforementioned. The radiation pattern from the conical device is axially symmetric and is advantageous for focusing or de-focusing with packaging or secondary optics.

Figure 7:
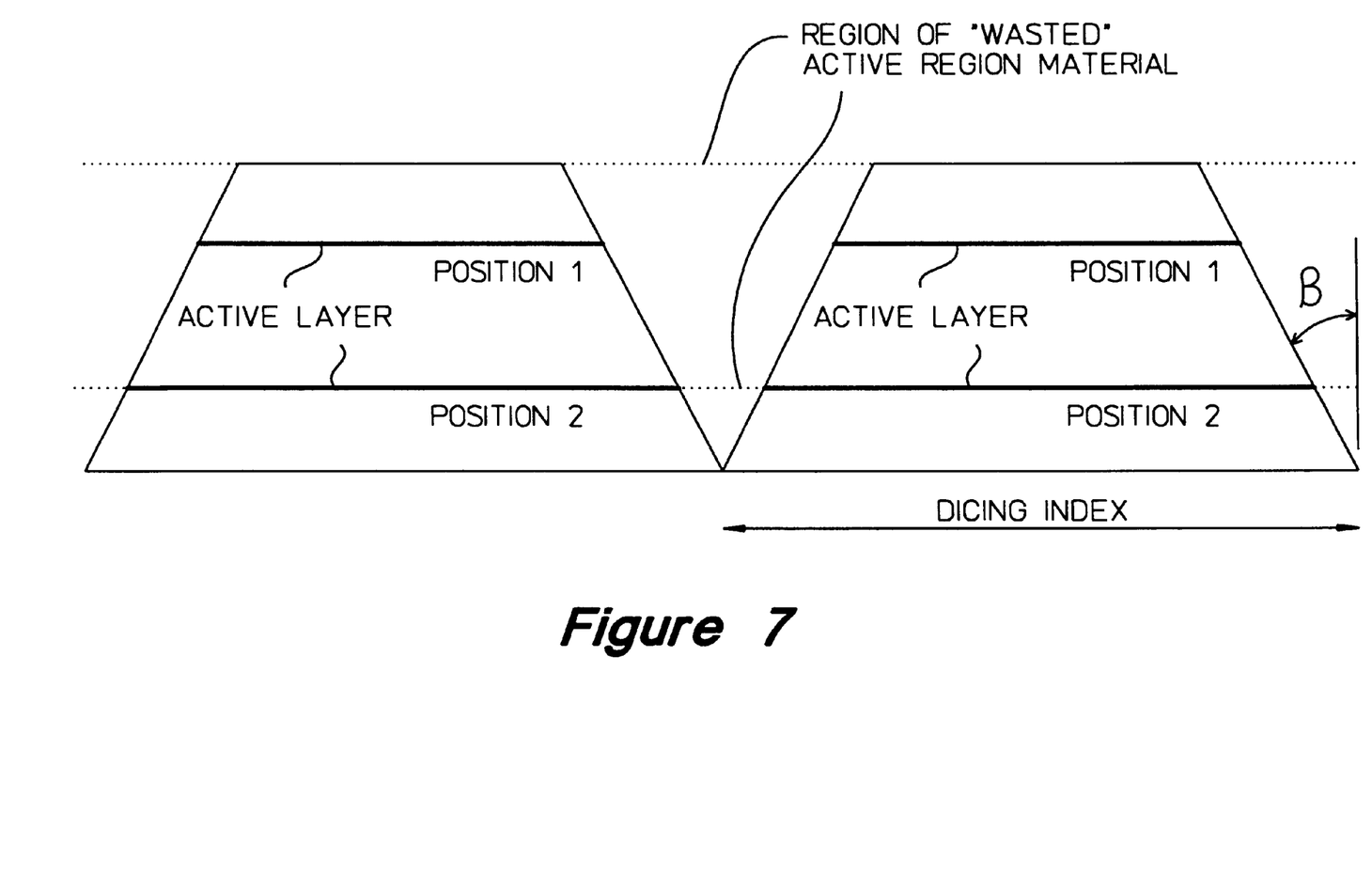
FIG. 7 illustrates a method of increasing area yield in a preferred embodiment.

A device with angled side-surfaces exhibits an increase in area-ratio of the maximum extent of the device (the top device area) relative to the active area. For a given choice of active area, this results in a reduction of the number of available devices per unit of area on a wafer (relative to conventional geometries). The importance lies in the fact that the epitaxial layers comprising the active layer and the p-n junction are typically the most expensive cost driver for the wafer. This area yield reduction increases as the top window height is increased. It also increases as the sidewall angle is increased. For a wafer being diced into inverted truncated-pyramid devices using beveled sawing (shown in FIG. 7), if the active layer is 50 μm from the top of a wafer (during dicing) that is 250 μm thick (position 1), and the dicing index is 500 μm, then the device yield per wafer for an inverted truncated-pyramid device with $\beta=30°$ would be roughly 29% relative to a conventional device. Placing the active layer closer to the bottom of the wafer during dicing, e.g. 200 μm from the wafer bottom (position 2), the device area yield increases to ~78%. That is, as the junction is moved away from the bottom of the device, the area yield loss is reduced (increasing the number of devices per wafer and thus, improving the cost-effectiveness of this device). Of course, the extraction efficiency of the device may also be reduced since the top window height of the device is effectively decreased. However, the decrease in efficiency with junction placement will be less severe as the absorption of the active layer is reduced (either by increasing the internal quantum efficiency of the active layer or by decreasing the active layer thickness) since photons may survive more passes through the active layer before being absorbed without re-emission. For example, in reducing the active layer thickness from 1.0 to 0.1 $\mu$m, the increase in transmission per pass (vertically) is from 37% to 90%. Cost-effective solutions must account for junction placement, sidewall angle, window height(s), and internal efficiency of the active area along with loss mechanisms, e.g. absorbing ohmic contacts, for proper device design. This is one aspect of the present invention. It is preferable to have a wide range of control over junction placement within the device. Positioning the location of the junction allows the design of an LED with a large extraction efficiency improvement (>1.4×) that more closely matches the added cost of manufacturing due to active-area yield loss. Based on the expected light output gains (>1.4×), it is preferable to maintain an area yield >33%.

There are several arguments for maintaining an area-yield due to chip-shaping that is greater than 33%. For one, typical yields for high-volume fabrication of mature-technology LEDs are in the range of ~30–50%. It is preferable to maintain an area-yield that is at least on par with that of conventional LED yields so that shaping alone does not put a hard upper-limit on achievable improvements in yields. Secondly, we have fabricated many shaped LEDs with geometries that correspond to area-yields >33% and which exhibit extraction efficiency gains >1.4× over conventional devices. Finally, for certain systems applications it is acceptable to triple the die-cost in exchange for a 40% gain in efficiency, especially since the die-cost makes up only a fraction of the total cost of the system.

In the trade-off between yield and extraction efficiency, a cost-effective solution is possible by changing device height, sidewall angle, and junction position parameters. Device height is controlled by substrate thickness, e.g. sawing, lapping, polishing, or etching, or layer growth times. Sidewall angle is determined by the fabrication technique, and can be very well-defined, e.g. beveled sawing, photoelectrochemical etching, or crystallographic etching. Junction position is controlled by growth times to a certain extent (epitaxial windows), but the full range of junction positions is more readily obtained by varying the thickness of wafer-bonded layers. For example, the active layer may be positioned almost exactly in the center of a 8-mil high device by simply wafer-bonding 4-mil substrates on either side.

Figure 8:
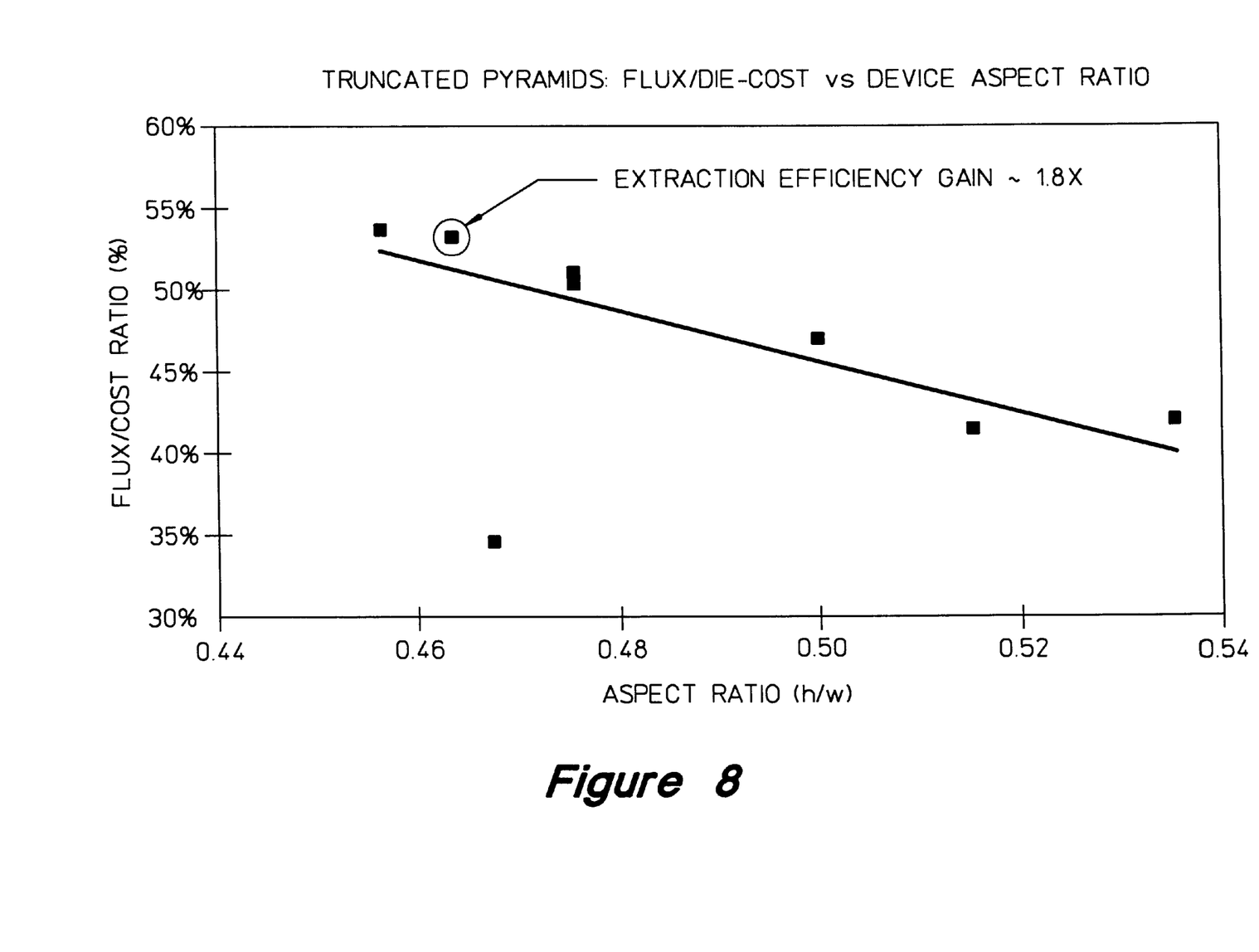
FIG. 8 illustrates relationships between flux gain and die cost in several preferred embodiments.

A consequence of device geometry on total flux gain including area yield is illustrated in FIG. 8. Here is plotted, on the y-axis, experimental total flux gain (in lumens) for inverted truncated pyramid LEDs ($\beta$=35°) divided by the area-ratio of the top extent of the device relative to the active area. This area-ratio is inversely proportional to the number of devices available per wafer and is thus directly proportional to the cost of manufacture of the LED die. Thus, the y-axis is essentially the ratio of total flux gain vs. die-cost relative to counterpart conventional devices (vertical sidewalls) all driven at the same current density of 107.7 A/cm$^2$. The x-axis is the geometric aspect ratio (top-window height divided by active region width) of the pyramid LEDs. FIG. 8 illustrates the general trend of reduced flux per monetary unit (MU) as the aspect ratio of the device increases. For a fixed active region width, the trend suggests that a thinner top window will provide a more favorable situation in terms of flux per MU. The top window must be thick enough to meet the extraction efficiency requirements of the application. For example, for the conventional device, the flux/cost ratio is 1.0 (obviously, as we have normalized to this!). But there is no gain in extraction efficiency for the conventional device. Also, the die-cost increase has been exaggerated because kerf loss associated with manufacture of the conventional LEDs has been neglected. Furthermore, since the die-cost is only a fraction of the cost of a finished LED lamp, the flux per MU situation is in fact much better (in terms of numbers) than illustrated in FIG. 8 for the shaped LEDs. Proper device design must achieve the appropriate balance between flux per MU and minimum required extraction efficiency which varies from application to application.

Figure 9:
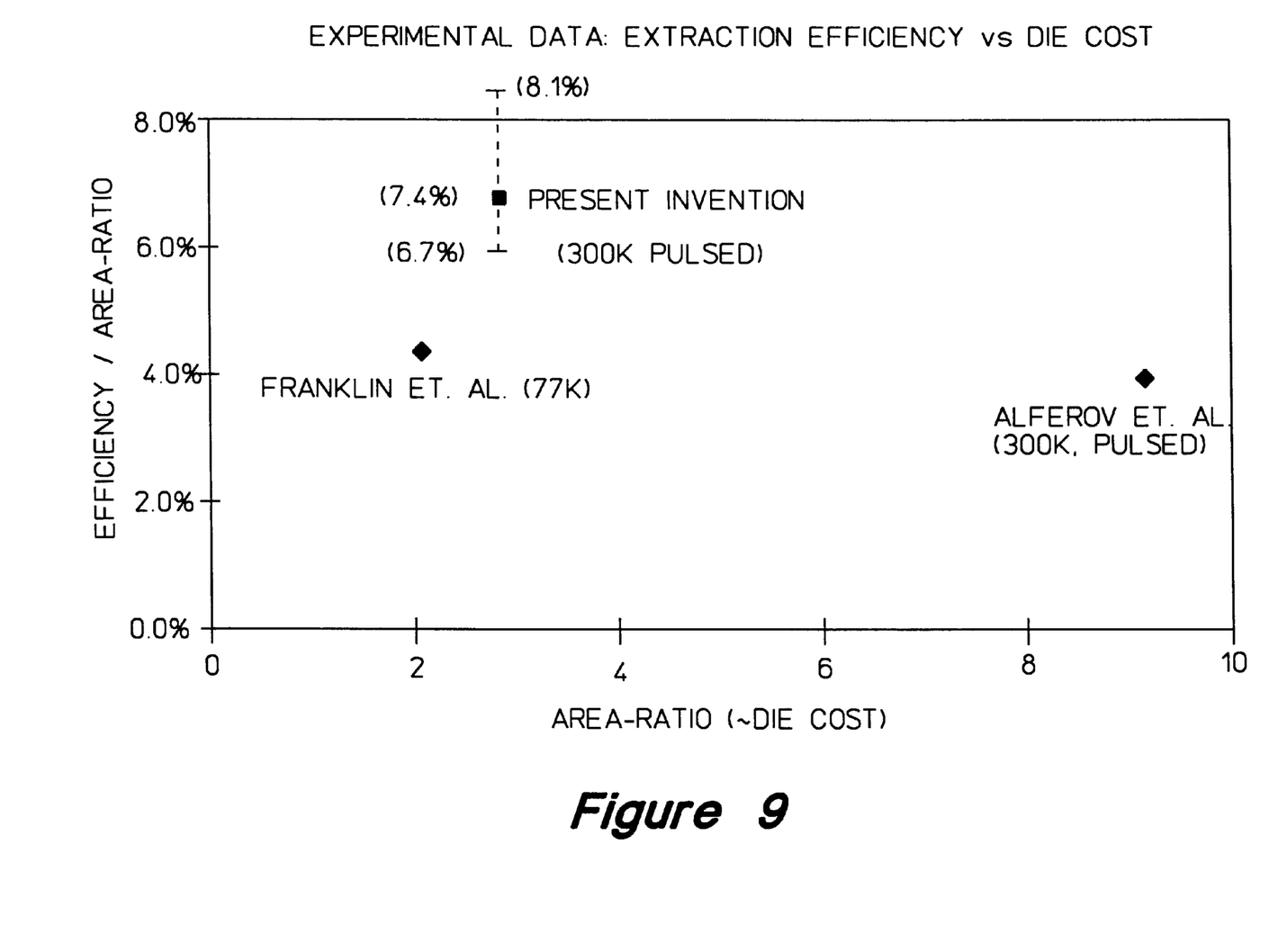
FIG. 9 illustrates advantages in a preferred embodiment over the prior art.

FIG. 9 illustrates an improvement of the present invention over the prior art. The x-axis is area-ratio of the top-surface extent of a device relative to the active area (~die-cost). The y-axis is extraction-efficiency divided the area-ratio, and is essentially a measure of the cost of light-output efficiency in a device (lumen per amp per MU). The two diamond-shaped points are from the prior art and are plotted using measured external quantum efficiencies (in air) as the numbers for extraction efficiency (i.e. assuming 100% internal quantum efficiency, which is reasonable for these devices and testing conditions). The third data point (square and error bars) in FIG. 9 corresponds to the present invention and is for an inverted truncated-pyramid LED ($\beta$=35°, $h_T$=8.5 mils, AlInGaP LED at 636 nm). Since the internal quantum efficiency of the AlInGaP LED is less than 100% (as is known in the art), the extraction efficiency is estimated from experimental light output gains over conventional (rectangular parallelipiped) AlInGaP LEDs from the same material. In this case, the device has an extraction efficiency in the range of ~18–22% and, by design, an area-ratio <3. Note that this device exhibits an improved relationship between efficiency and cost relative to the devices of the prior art. The device described by Alferov, while exhibiting high external quantum efficiency, would have an excessive die-cost (>9×) based upon the chosen geometry. The device of Franklin et. al. employs an acceptable geometry in term of die-cost but suffers from poor external quantum efficiency due to lack of side-light extraction and poor window transparency. It is clear that device designs within the present teaching result in substantial improvement in the relationship between efficiency and cost and have significant implications for use of LEDs in many applications.

Figure 10:
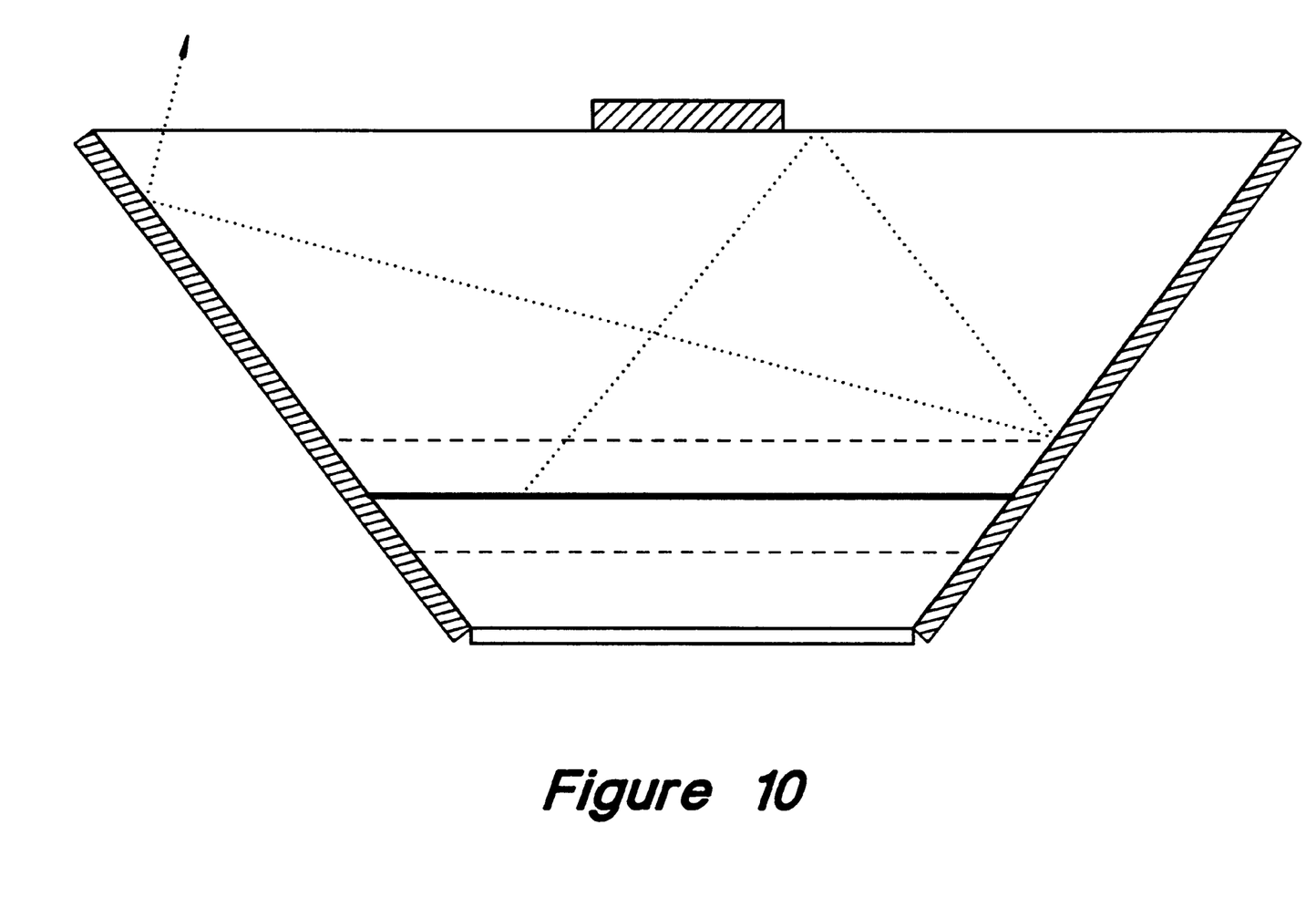
FIG. 10 illustrates a side view of another embodiment.

FIG. 10 depicts a side view of another embodiment. The shaped sidewalls are coated with a highly reflective thin film 30 that may be metallic or dielectric or some combination thereof to inhibit light from escaping out the side-surfaces of the device and promote light exiting through the top surface. The optical design for the packaging scheme is simpler since all light is emitted from a single planar surface. The optical package does not require a highly reflecting mounting surface for the LED because there is no backward-traveling light to be redirected. Furthermore, a portion of the reflective thin film coating may be one of the ohmic electrical contacts to the device to eliminate a wire-bond attachment to a top contact at the device top surface. This reduces reliability problems associated with the wire-bond, removes the wire-bonding step from the manufacturing process, and eliminates top-contact occlusion for light within the device. This contacting scheme may include transparent ITO as an ohmic contact which is subsequently covered with dielectric or metal layers to provide high reflectivity. Alternatively, the shaped side surfaces may be coated with an anti-reflective coating, typically a dielectric (e.g., $SiO_2$, $Si_3N_4$, $Al_2O_3$) thin film or a multi-layer stack of dielectric films as is known in the art or disclosed in the Handbook of Optics, by Driscoll et al. (McGraw-Hill, New York, 1978) sections 8.1–8.124.

Figure 11:
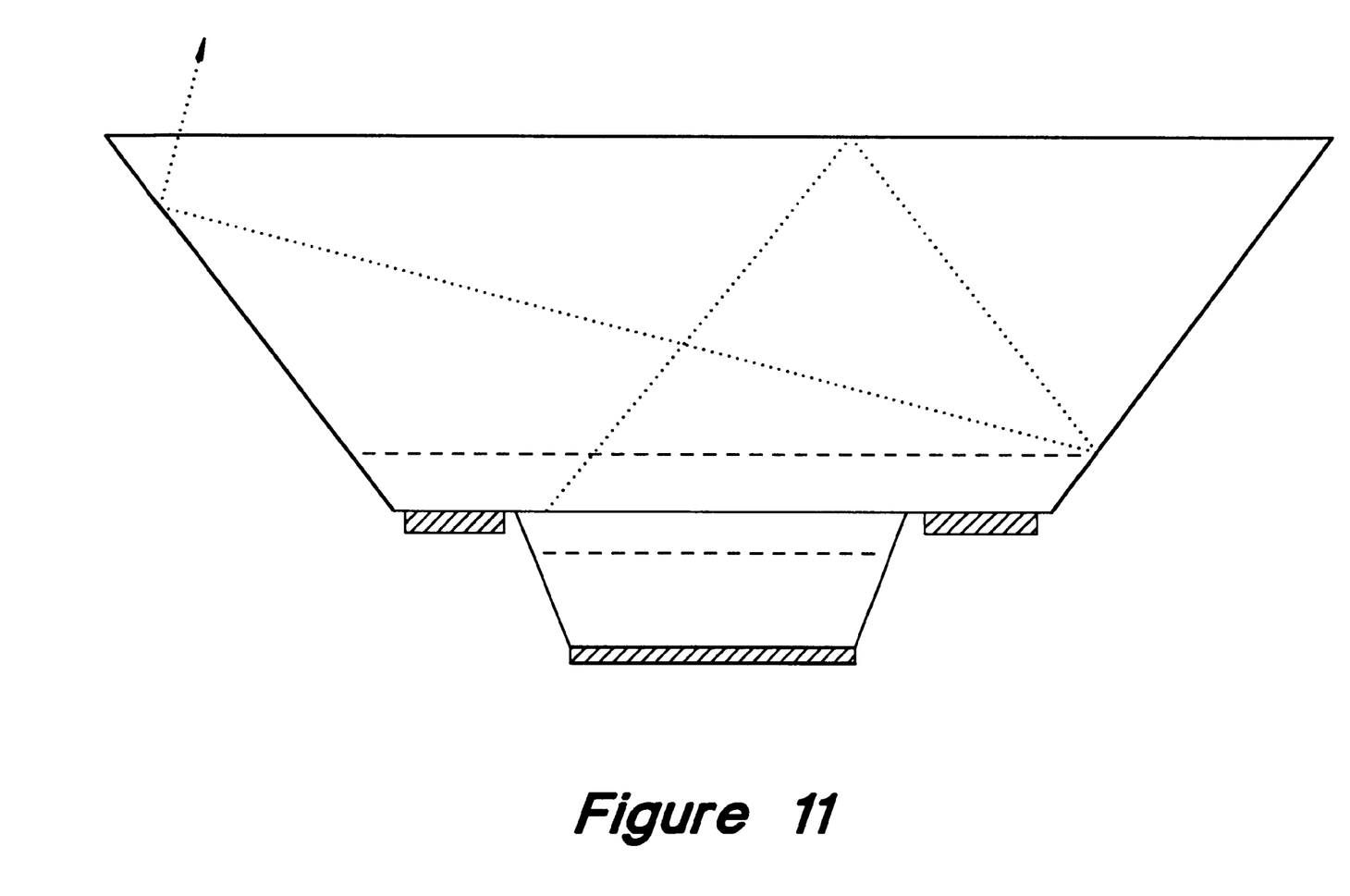
FIG. 11 illustrates an alternate embodiment that has both p and n electrical contacts with the same surface orientation.

FIG. 11 depicts another preferred embodiment, the electrical contacts to both sides of the p-n junction are formed on the bottom mounting surfaces of the device. There is no occlusion from a top contact and no requirement for a wire-bond for forming a current path in the packaged device. The contact geometry and current-spreading is such that reasonably uniform injection into the active layer is achieved. Since no conduction path is required through the top window layer, the top window layer need not be doped. This layer need not be a semiconductor, but may be any transparent material that may be attached to the epitaxial layers to form an optical interface for light extraction from the device active region.

What is claimed is:

1. A semiconductor light-emitting device with improved side light extraction efficiency comprising:
    a multi-layered heterostructure having a first side;
    a p-n junction, within the multi-layered heterostructure, that defines an active device area;
    ohmic contracts electrically connecting to the p-n junction;
    a primary transparent window, abutting the first side, having a top device area and a frustum, wherein at least ≧50% of the frustum is at an oblique angle with respect to the multi-layered heterostructure, wherein the top device area is greater than the active device area; and
    wherein the oblique angle is selected to increase the light escaping through the frustum.

2. A semiconductor light-emitting device, as defined in claim 1, wherein the active device area of the p-n junction region is greater than 150 $mil^2$.

3. A semiconductor light-emitting device, as defined in claim 1, wherein the primary transparent window layer has a thickness between 50 and 250 microns.

4. A semiconductor light-emitting device, as defined in claim 1, wherein the oblique angle is between 20 and 50 degrees.

5. A semiconductor light-emitting device, as defined in claim 1, wherein the top device area is selected from a group that includes a square, a circle, and a triangle.

6. A semiconductor light-emitting device, as defined in claim 1, wherein the ratio of the top device area to the active device area is less than 3.

7. A semiconductor light-emitting device, as defined in claim 1, wherein the primary transparent window is a substrate.

8. A semiconductor light-emitting device, as defined in claim 1, further comprising a secondary transparent window abutting a second side of the multi-layered heterostructure, wherein the second side is parallel to the first side.

9. A semiconductor light-emitting device, as defined in claim 8, further comprising a reflector, attached to the secondary transparent window, having an angle-averaged reflectivity greater than 50%.

10. A semiconductor light-emitting device, as defined in claim 8, wherein the secondary transparent window has a thickness between 50 and 250 microns.

11. A semiconductor light-emitting device, as defined in claim 1, further comprising a highly reflective metal on the side surface such that the reflectivity within the primary transparent window is greater than 80%.

12. A semiconductor light-emitting device, as defined in claim 1, further comprising one or more of the electrical contacts being positioned on the bottom of the primary transparent window.

13. A semiconductor light-emitting device, as defined in claim 1, further comprising a reflector, attached to a second side of the heterostructure, having an angle-averaged reflectivity greater than 50%.

14. A semiconductor light-emitting device, as defined in claim 1, wherein the specific contact resistance of at least one of the ohmic contacts is less than $5 \times 10^{-5}$ ohms-$cm^2$.

15. A semiconductor light-emitting device with improved side light extraction efficiency comprising:
    a multi-layered heterostructure having a first side;
    a p-n junction, within the multi-layered heterostructure, that defines an active device area;
    ohmic contacts electrically connecting to the p-n junction;
    a primary transport window, abutting the first side, having a top device area and a frustum, wherein at least ≧50% of the frustum is at an oblique angle with respect to the multi-layered heterostructure, wherein the top device area is greater than the active device area;
    an area yield, wherein area yield is defined as the ratio of the active device area to the top device area; and
    wherein the oblique angle is selected to increase the light escaping through the frustum.

16. The semiconductor light-emitting device, as defined in claim 15, wherein the area yield is greater than 33%.

17. The semiconductor light-emitting device, as defined in claim 16, wherein the thickness of the primary window is less than 250 µm.

18. The semiconductor light-emitting device, as defined in claim 16, wherein the oblique angle is less than 50°.

* * * * *